US011688820B2

United States Patent
Oh et al.

(10) Patent No.: US 11,688,820 B2
(45) Date of Patent: Jun. 27, 2023

(54) PHOTODETECTORS

(71) Applicant: Regents of the University of Minnesota, Minneapolis, MN (US)

(72) Inventors: Sang-Hyun Oh, Plymouth, MN (US); Daehan Yoo, St. Paul, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 17/066,735

(22) Filed: Oct. 9, 2020

(65) Prior Publication Data

US 2021/0111298 A1 Apr. 15, 2021

Related U.S. Application Data

(60) Provisional application No. 62/913,587, filed on Oct. 10, 2019.

(51) Int. Cl.
 *H01L 31/108* (2006.01)
 *H01L 31/18* (2006.01)
 *H01L 31/028* (2006.01)
 *H01L 31/0224* (2006.01)

(52) U.S. Cl.
 CPC ........ *H01L 31/1085* (2013.01); *H01L 31/028* (2013.01); *H01L 31/022416* (2013.01); *H01L 31/1808* (2013.01)

(58) Field of Classification Search
 CPC ......... H01L 31/1085; H01L 31/022416; H01L 31/028; H01L 31/1808; H01L 31/035281; H01L 31/108; G01J 2005/204; G01J 5/20
 See application file for complete search history.

(56) References Cited

U.S. PATENT DOCUMENTS

| 9,417,387 | B2 | 8/2016 | Avouris et al. |
| 9,423,345 | B2 | 8/2016 | Avouris et al. |
| 2016/0033401 | A1 | 2/2016 | Farmer |
| 2016/0161675 | A1 | 6/2016 | Englund et al. |
| 2017/0249520 | A1* | 8/2017 | Lee ................. H01L 31/0203 |

(Continued)

FOREIGN PATENT DOCUMENTS

| CN | 105355702 | 2/2016 |
| CN | 106596449 | 4/2017 |
| CN | 107561028 | 1/2018 |

(Continued)

OTHER PUBLICATIONS

Alonso-Gonzalez et al., "Acoustic terahertz graphene plasmons revealed by photocurrent nanoscopy," Nat. Nanotechnology, Jan. 2017, 12(1):31-36.

(Continued)

*Primary Examiner* — Dao H Nguyen
(74) *Attorney, Agent, or Firm* — Fish & Richardson P.C.

(57) ABSTRACT

The subject matter of this specification can be embodied in, among other things, a photodetector that includes a semiconductor substrate, a semiconductor annulus on a planar face of the semiconductor substrate, and a metal layer on the semiconductor substrate, wherein the metal layer comprises a first region surrounding the semiconductor annulus and comprises a second region filling an interior region to the semiconductor annulus, and the metal layer in the first region forms a Schottky junction with the semiconductor ring.

27 Claims, 9 Drawing Sheets

(56) References Cited

U.S. PATENT DOCUMENTS

2018/0361400 A1    12/2018    Oh et al.
2020/0387044 A1    12/2020    Oh et al.

FOREIGN PATENT DOCUMENTS

KR      101177715      8/2012
KR      102187443      12/2020

OTHER PUBLICATIONS

Autore et al., "What momentum mismatch?" Nat. Nanotechnology, Feb. 11, 2019, 14:308-309.

Chalabi et al., "Hot-Electron Photodetection with a Plasmonic Nanostripe Antenna," Nano Letters, Mar. 2014. 14(3):1374-1380.

Chen et al., "Acoustic Graphene Plasmon Nanoresonators for Field-Enhanced Infrared Molecular Spectroscopy," ACS Photonics, Oct. 9, 2017, 4(12):3089-3097.

Desiatov et al., "Plasmonic enhanced silicon pyramids for internal photoemission Schottky detectors in the near-infrared regime," Optica, Apr. 2015, 2(4):335-338.

Gong et al., "Angle-Independent Hot Carrier Generation and Collection Using Transparent Conducting Oxides," Nano Letters, Jan. 2015, 15(1):147-152.

Iranzo et al., "Probing the ultimate plasmon confinement limits with a van der Waals heterostructure," Science, Apr. 20, 2018, 360(6386):291-295.

Knights et al., "Photodetection with Active Optical Antennas," Science, May 6, 2011. 332:702-704.

Lee et al., "Graphene acoustic plasmon resonator for ultrasensitive infrared spectroscopy," Nat. Nanotechnology, Feb. 11, 2019, 14:313-319.

Li et al., "Harvesting the loss: surface plasmon-based hot electron photodetection," Nanophotonics, Jun. 2017, 6(1):177-191.

Li et al., "Metamaterial Perfect Absorber Based Hot Electron Photodetection," Nano Letters, Jun. 2014, 14(6):3510-3514.

Lundeberg et al., "Tuning quantum nonlocal effects in graphene plasmonics," Science, Jul. 14, 2017, 357(6347):187-191.

Rodrigo et al., "Mid-infrared plasmonic biosensing with graphene," Science, Jul. 10, 2015, 349(6244):165-168.

Sobhani et al., "Narrowband photodetection in the near-infrared with a plasmon-induced hot electron device," Nat. Communications, Mar. 27, 2013, 4:1643, 6 pages.

Yan et al., "Damping pathways of mid-infrared plasmons in graphene nanostructures," Nat. Photonics, May 2013, 7(5):394-399.

Yan et al., "Tunable infrared plasmonic devices using graphene/insulator stacks," Nat. Nanotechnology, 7(5):330-334.

Yoo et al., "High-Contrast Infrared Absorption Spectroscopy via Mass-Produced Coaxial Zero-Mode Resonators with Sub-10 nm Gaps," Nano Letters, Mar. 2018, 18(3):1930-1936.

Yoo et al., "High-Throughput Fabrication of Resonant Metamaterials with Ultrasmall Coaxial Apertures via Atomic Layer Lithography," Nano Letters, Mar. 2016, 16(3):2040-2046.

U.S. Appl. No. 16/894,314, filed Jun. 5, 2020, Sang-Hyun Oh, Published.

Ogawa et al. "Effect of graphene on plasmonic metasurfaces at infrared wavelengths" AIP Advances, https://doi.org/10.1063/1.4834976 (Year: 2013).

Wei et al. "Cavity-enhanced continuous graphene plasmonic resonator for infrared sensing" Optical Communications, 395, pp. 147-153 (Year: 2017).

\* cited by examiner

PHOTODETECTORS

CROSS REFERENCE TO RELATED APPLICATIONS

This application claims priority under 35 U.S.C. § 119 from U.S. Provisional Application No. 62/913,587, filed on Oct. 10, 2019, the entire contents of which is incorporated herein by reference.

TECHNICAL FIELD

This instant specification relates to photodetectors, more specifically photodetectors that function for mid-infrared (MIR) and long wavelength infrared (LWIR) regimes.

BACKGROUND

In the conventional viewpoint of the photoexcitation and non-radiative decay of carriers, hot electrons, which are not in thermal equilibrium, serve as a parasitic process that limits the performance of optoelectronic or plasmonic devices, for instance, limiting propagation length in plasmonic waveguides and optical absorption in the metal, thus reducing performance.

In general, capturing the low-energy photons at long wavelength infrared regime necessitates the low bandgap material such as mercury cadmium telluride (MCT) with the inter-band transitions between conduction band and valence band. MCT, however, is a high-cost technology mainly due to the growth technique. In addition, it is not trivial to integrate such material with CMOS fabrication processes. Furthermore, MCT is toxic and can contribute to environmental pollution.

SUMMARY

In general, this document describes photodetectors that function for mid and long wavelength infrared regimes.

In a general aspect, a photodetector includes a semiconductor substrate, a semiconductor annulus on a planar face of the semiconductor substrate, and a metal layer on the semiconductor substrate, wherein the metal layer comprises a first region surrounding the semiconductor annulus and comprises a second region filling an interior region to the semiconductor annulus, and the metal layer in the first region forms a Schottky junction with the semiconductor ring.

Various embodiments can include some, all, or none of the following features. The photodetector can also include an electrically insulating dielectric material on a surface of the semiconductor annulus, wherein the electrically insulating dielectric material is between the semiconductor annulus and the metal layer in the first region. The electrically insulating dielectric material can be an oxide layer. The semiconductor annulus can be integrally formed with the semiconductor substrate. At least one of the semiconductor substrate or the semiconductor ring can be germanium. The metal layer can include one or more of copper, gold, silver, or aluminum. The semiconductor annulus can be circular. The semiconductor annulus can be polygonal. The photodetector can include a collection of the semiconductor annuli arranged in an array on the semiconductor substrate. The semiconductor annulus can have a thickness of between 50 nm and 200 nm perpendicular to the planar face of the semiconductor substrate. The photodetector can be configured to convert photons having wavelengths between 2 microns and 30 microns to electrical current. The photodetector can include a first electrical contact electrically connected to the semiconductor substrate and a second electrical contact electrically connected to the metal layer in the first region.

In another general aspect, a method of fabricating a photodetector includes providing a semiconductor substrate, forming a semiconductor annulus on a planar face of the semiconductor substrate, and forming a metal layer on the planar face of the semiconductor substrate, wherein the metal layer includes a first region surrounding the semiconductor annulus and forms a Schottky junction with the semiconductor ring, and a second region filling an interior region to the semiconductor annulus.

Various implementations can include some, all, or none of the following features. The method can also include forming an electrically insulating dielectric material on a surface the semiconductor annulus, wherein the electrically insulating dielectric material is between the semiconductor annulus and the metal layer in the first region. The insulating dielectric material can be an oxide layer. Forming the semiconductor annulus can include growing a hard mask layer on the planar face of the semiconductor substrate, patterning a photoresist layer on the hard mask layer, the photoresist layer having a predetermined pattern, etching the hard mask layer based on the photoresist layer to expose the semiconductor substrate, and etching the semiconductor substrate based on the hard mask layer to define the semiconductor annulus based on the predetermined pattern. Forming the metal layer on the semiconductor substrate can include depositing a metal over the semiconductor substrate and the semiconductor annulus, and planarizing the metal to expose the semiconductor annulus. The semiconductor annulus and the metal layer can be formed by CMOS-compatible fabrication processes. At least one of the semiconductor substrate or the semiconductor annulus can be germanium. The metal layer can include one or more of copper, gold, silver, or aluminum. The semiconductor annulus can be circular. The semiconductor annulus can be polygonal. The method can also include a collection of the semiconductor annuli arranged in an array on the semiconductor substrate. The semiconductor annulus can have a thickness of between 50 nm and 100 nm perpendicular to the planar face of the semiconductor substrate. The semiconductor ring and the metal layer can be configured to convert photons having wavelengths between 2 microns and 30 microns. At least a portion of the metal layer can define a Schottky junction with the semiconductor substrate.

The systems and techniques described here may provide one or more of the following advantages. First, a system can provide detection of infrared radiation in mid and long wavelength spectra. Second, the design of the system can be tuned for predefined bands of wavelengths. Third, the system can be fabricated using CMOS-compatible materials and fabrication equipment. Fourth, the system can be fabricated without the use of mercury cadmium telluride.

The details of one or more implementations are set forth in the accompanying drawings and the description below. Other features and advantages will be apparent from the description and drawings, and from the claims.

DETAILED DESCRIPTION

The present disclosure relates to photodetectors, including photodetectors that function in the mid and long wavelength infrared regimes, and methods for fabricating such photodetectors.

A Schottky barrier is formed, in certain implementations, at the interface between a semiconductor and a metal, in which the different in band energies creates a barrier for electrons to pass. In certain implementations, it is possible to generate hot electrons near the interface of the Schottky barrier. Hot electrons having energy greater than the Schottky barrier can flow into the semiconductor through an internal photoemission process, generating photocurrent. In particular implementations, hot electrons are generated in the metal through the absorption of photons. A portion of the hot electrons then diffuse to the metal-semiconductor interface before thermalization, and hot electrons with sufficient energy and the correct momentum are injected into the conduction band of the semiconductor through internal photoemission.

Transmission of light through coaxial apertures defined by semiconductor annuli can be understood as an epsilon-near-zero (ENZ) effect, leading to highly efficient coupling of light into narrow apertures. In addition to extremely small mode volumes, these resonant ENZ modes can offer spatially uniform electric fields extending throughout the entire cavity, due to a very long wavelength at near-zero permittivity. Therefore, if semiconducting materials are placed within the coaxial apertures defined in a metal layer (e.g., forming an annulus or ring of semiconductor material filled and surrounded by metal), the interface of the metallic coaxial apertures and semiconductors will form Schottky junctions, where substantially all hot electrons generated will be efficiently captured through an internal electric field. The coaxial apertures thus provide a platform to achieve highly efficient photodetection at mid-infrared (MIR) frequencies or long-wavelength infrared (LWIR) frequencies.

Figure 1:
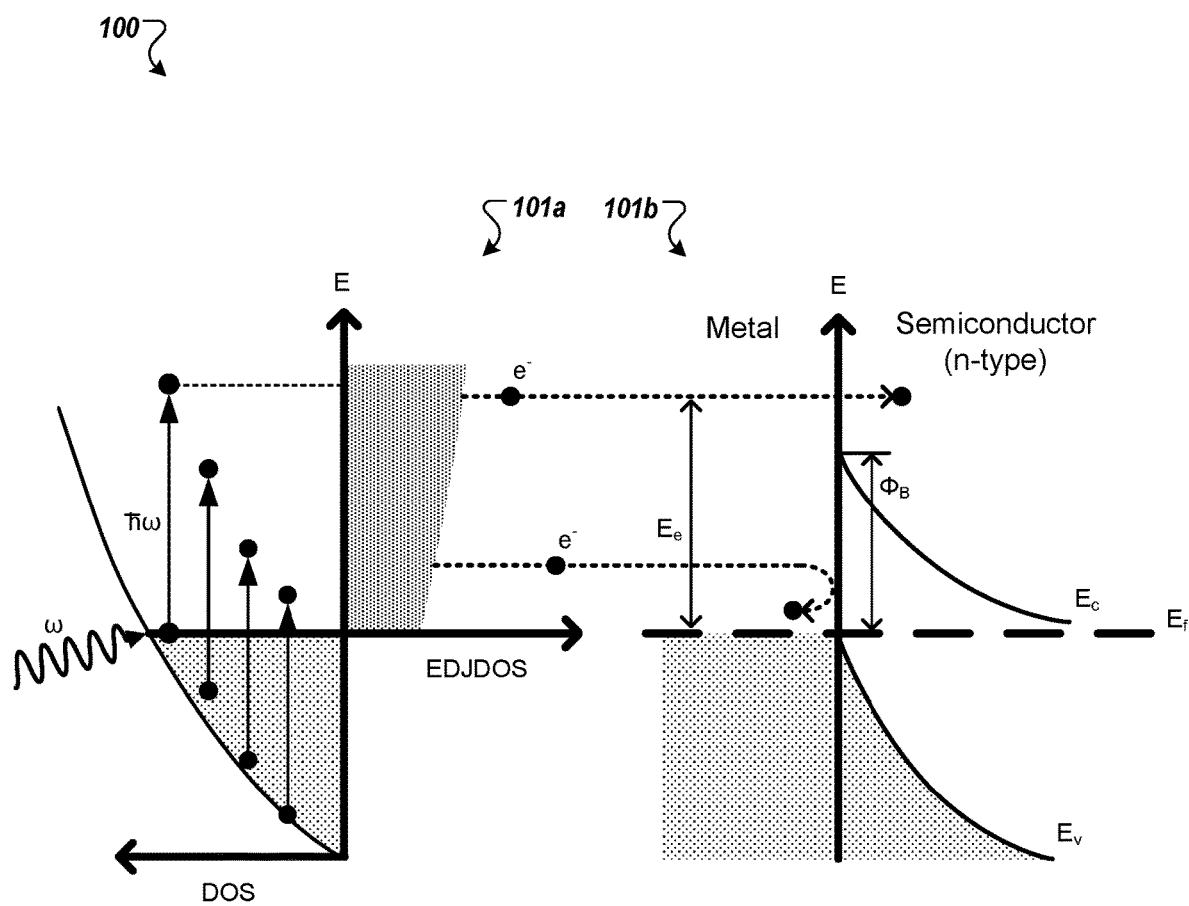
FIG. 1 is a graph illustrating an example of energy band diagrams.

FIG. 1 is a schematic that illustrates an example of an energy diagram 101a in which electrons in a metal are excited from occupied energy levels in the conduction band to unoccupied levels above the Fermi energy. Also shown in FIG. 1 is an energy band diagram 101b for an exemplary Schottky junction at the metal-semiconductor interface. Hot electrons with energy larger than the Schottky barrier can pass over the barrier into the semiconductor. The efficiency of photocurrent generation in a bulk metal/semiconductor Schottky junction, however, may be very poor due to low light absorption, broad hot electron energy distribution, and/or isotropic hot electron momentum distribution.

An alternative, and in some cases more efficient approach, to generating photocurrent in a Schottky structure is based on the use of metallic nanoparticles that generate surface plasmons. Such nanoparticles, also referred to as "plasmonic nanoparticles," have an absorption cross-section much larger than the physical size of the particles, yielding much more efficient hot electron generation than bulk metal. Absorption cross-section is a measure for the probability of an absorption process, which is proportional to the physical size of the particle. However, if the particle has the optical resonance such as plasmonics, it will be able to absorb the light more than its physical size. In certain cases, plasmonic nanoparticles also produce hot carriers at a higher average energy compared to hot carriers produced by absorption in bulk metals. Additionally, in some implementations, the momentum distribution of hot carriers can be modified by engineering the modes of the plasmonic structures. Therefore, surface plasmons can provide a powerful tool for efficient hot electron generation and extraction.

Figure 2A:
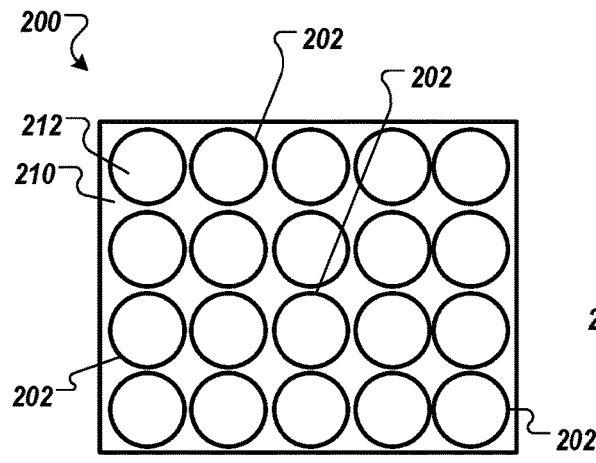
FIGS. 2A and 2C are schematics that show examples of coaxial nanoapertures with diverse diameters.
Figure 2C:
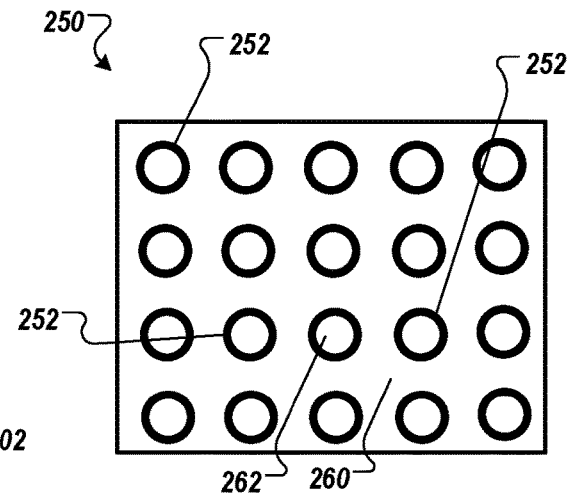

FIGS. 2A and 2C are schematics that illustrate a top view of exemplary photodetectors (200, 250) that include multiple plasmonic nanostructures combined with semiconductors to form Schottky barriers. In the examples of FIGS. 2A and 2C, the photodetectors 200, 250 include semiconductor annulus structures referred to herein as coaxial nanoapertures 202, 252, respectively or simply "nanoapertures." The nanoapertures 202, 252 can be formed from a semiconductor material, such as silicon or germanium. The regions, such as outer regions 210 and 260, surrounding the outer perimeter of the nanoapertures 202, 205 can include a metal, such as copper, gold, silver, or aluminum, thus forming a Schottky junction at the interfaces between the outer nanoaperture surface and the metal. In some implementations, the regions, such as interior regions 212 and 262, interior to the nanoapertures 202, 205 also include a metal, though other materials can be used or the interior regions of the nanoapertures 202, 205 can be left empty.

As photons (e.g., photons in the visible, near infrared or long infrared wavelength range) impinge on the metallic regions surrounding the nanoapertures, the photons are absorbed in the metal and surface plasmons are excited in and near the metal surface, leading to hot electron generation. The Schottky junction formed at the interface between metal and semiconductor provides a small energy barrier over which the hot electrons pass and are collected as current. Additionally, the resonant modes of the nanoapertures can create intense and spatially uniform electric fields along the entire thickness of the structure such that the efficiency of capture of the hot electrons can be improved. Compared to other types of optical nanostructures, the coaxial nanoaperture has a large volume and surface of hot spots where hot electrons are generated. Furthermore, the surface of hot spots corresponds to the Schottky junction, thus efficiently capturing the hot electrons. Said another way, the nanoapertures 202 and 252 are engineered semiconductor-metal structures that act as antennas to collect and concentrate light on Schottky junctions formed at the interfaces between the metal and the semiconductor. As explained in further detail below, these structures and the materials used to form them are compatible with CMOS fabrication techniques. In some embodiments, the photodetectors including the nanoapertures are configured to convert photons having wavelengths between 2 microns and 30 microns.

The diameters of the nanoapertures can vary, leading to different absorption spectra of the photodetectors. The wavelength of resonance redshifts as the inner diameter increases (e.g., as shown in FIG. 2D). The transmission will increase as the outer dimeter increases while the inner diameter is fixed, since the open area (e.g., the area of coaxial aperture) will increase. If the thickness of metal increases, the transmission can decrease due to the metallic losses. The nanoapertures 202, 252 shown in FIGS. 2A and 2C are illustrated as annular semiconductor structures. However, the nanoapertures are not limited to circular semiconductor annuli and can include other closed curve shapes, such as rectangular annuli, oval annuli, among others.

Figure 2B:
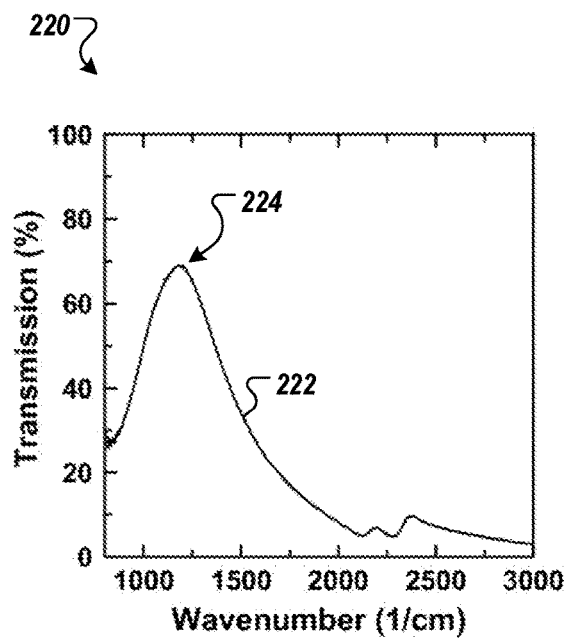
FIGS. 2B and 2D are plots that show example transmission spectra measured from the coaxial nanoapertures of FIGS. 2A and 2C, respectively.
Figure 2D:
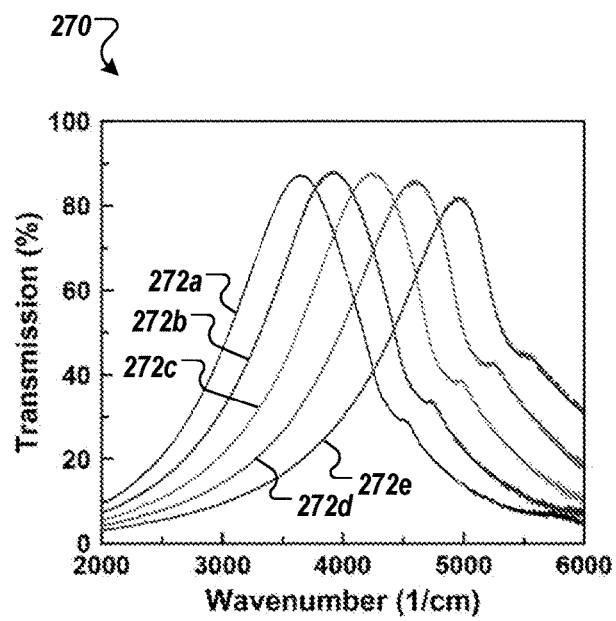

FIG. 2B is a graph 220 of example light transmissivity 222 of the example photodetector 200 of FIG. 2A. In the illustrated example, the transmissivity 222 exhibits a peak 224 at a wavenumber of around 1200. This location of this peak is directly related to the geometry of the nanoapertures 202 (e.g., outer diameter, inner diameter, height, period).

FIG. 2D is a graph 270 example light transmissivities 272a-272e of the example photodetector 250 of FIG. 2C. Each of the light transmissivities 272a-272e exhibits a different peak, and represents a different response based on a different configuration of the nanoapertures 252. In the illustrated example, the nanoapertures have a metal layer made of gold (Au), and the light transmissivity 272a corresponds to a nanoaperture having an inner diameter of about 500 nm, the light transmissivity 272b corresponds to a nanoaperture having an inner diameter of about 550 nm, the light transmissivity 272c corresponds to a nanoaperture having an inner diameter of about 6000 nm, the light transmissivity 272e corresponds to a nanoaperture having an inner diameter of about 650 nm, and the light transmissivity 272e corresponds to a nanoaperture having an inner diameter of about 700 nm.

Figure 3A:
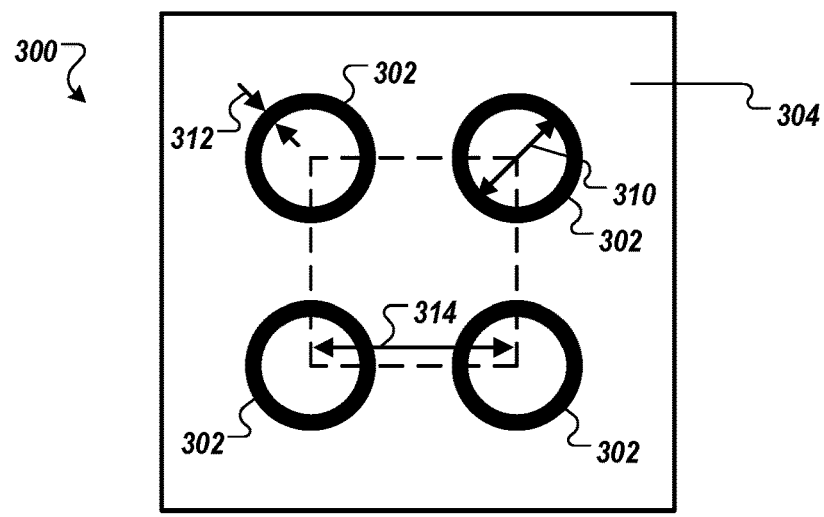
FIGS. 3A and 3B are schematics that show an example photodetector having coaxial nanoapertures.

FIG. 3A is a schematic that illustrates a top view of an example photodetector 300 that includes an array of nanoapertures 302. Each nanoaperture 302 is defined by a semiconductor ring having a corresponding inner diameter 310 and a width 312 (e.g., the difference between the inner and outer radii of the annulus). The array of semiconductor annuli is defined by a period 314, which corresponds to a spacing between adjacent rings. Exemplary inner diameters 310 are between about 100 nm to about 2000 nm. Exemplary widths 312 are in a range from about 20 nm to about 100 nm. Exemplary periods 314 are in a range from about 300 nm to about 2500 nm.

Figure 3B:
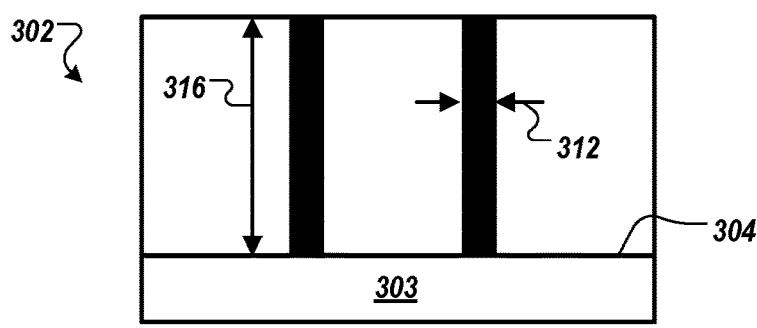

FIG. 3B is a schematic that illustrates a cross-sectional view of one of the nanoapertures 302. In the illustrated example, it can be seen that the nanoaperture 302 is formed on a planar face 304 of a substrate 303, and the nanoaperture 302 has the width 312 and a thickness 316 (e.g., height relative to the substrate 303). The thickness 316 can be in a range from about 50 nm to about 100 nm.

Figure 4:
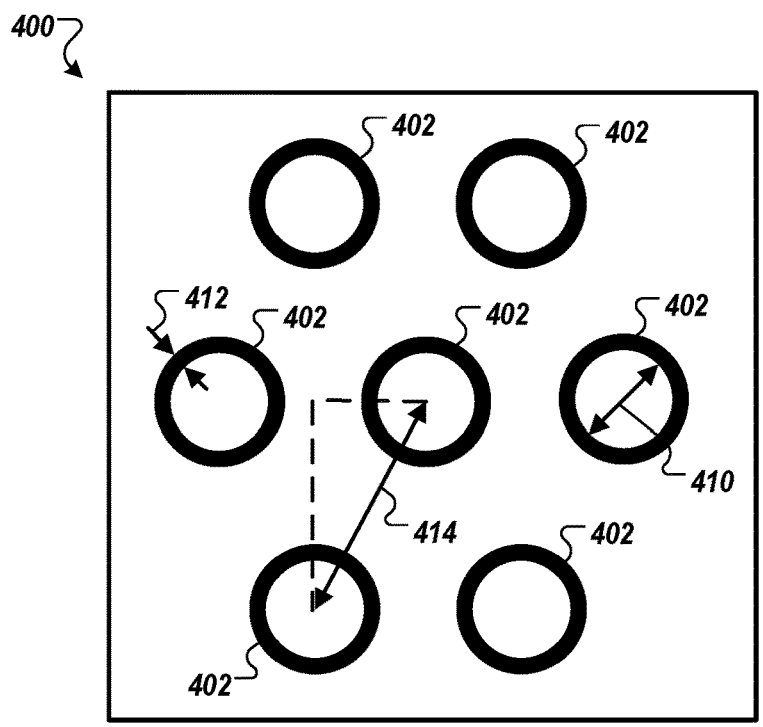
FIG. 4 is a schematic that shows an example photodetector having coaxial nanoapertures.

FIG. 4 is a schematic that illustrates a top view of another example photodetector 400 having a collection of nanoapertures 402 defined by semiconductor rings. Each of the semiconductor rings that define the nanoapertures 402 has a corresponding diameter 410, a corresponding width 412, and a thickness (not visible in this view). The nanoapertures 402 are arranged in a generally hexagonal pattern with a period 414 between adjacent nanoapertures 402.

Figure 5A:
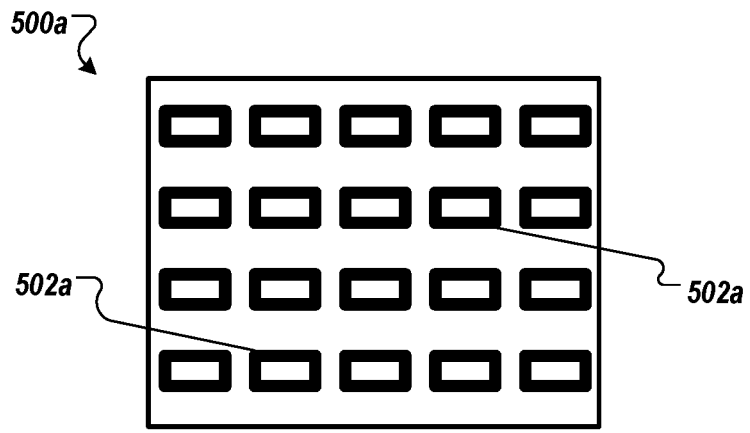
FIGS. 5A-5C are schematics that show examples of photodetectors having coaxial nanoapertures.
Figure 5B:
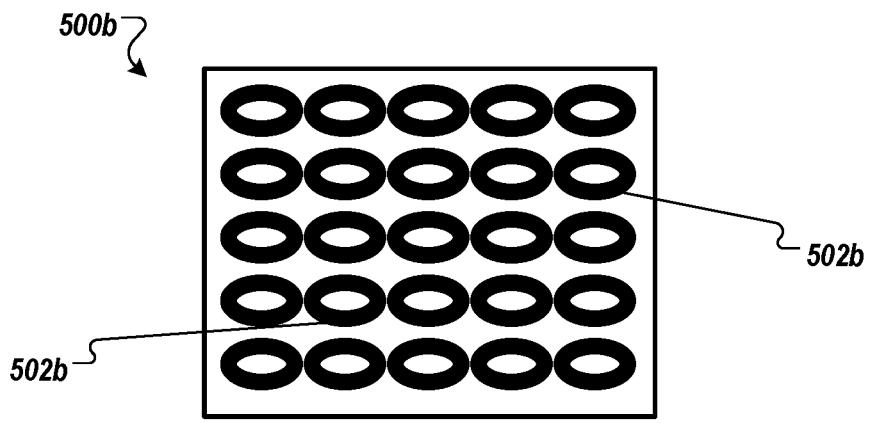
Figure 5C:
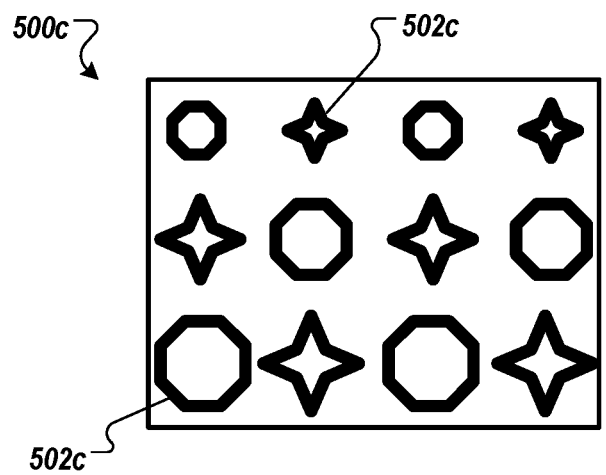

FIGS. 5A-5C are schematics that illustrate top views of other examples of photodetectors having nanoapertures. FIG. 5A shows an example photodetector 500a including a collection of nanoapertures 502a that have a generally elliptical semiconductor ring shape. FIG. 5B shows an example photodetector 500b including a collection of nanoapertures 502b having generally rectangular semiconductor ring shape. In some embodiments, the photodetectors 500a and 500b can be fabricated with features that are substantially similar to the example photodetectors 200, 250, 300, or 400 of FIGS. 2A, 2C, and 3A-4, but with different annular shapes. In the example photodetectors 200, 250, 300, or 400, the each nanoaperture is formed as a substantially circular annulus. However, any appropriate form of closed curved and/or annular shape can be used. For example, the nanoaperture can include a circular annulus, an elliptical annulus, a rectangular annulus, a trapezoidal annulus, triangular annulus, a hexagonal annulus, an octagonal annulus, a star-shaped annulus, or combinations of these and other shapes.

The use of non-perfectly symmetrical coaxial shapes such as ellipses, ovals, rectangles, trapezoids, or other directional shapes, such as the ellipses of FIG. 5A and the rectangles of FIG. 5B, can cause the photodetectors 500a and 500b to exhibit different sensitivities to different directions or polarization of incoming light. Such nanoapertures can be tuned for particular directional sensitivities by selecting appropriate ring configurations.

FIG. 5C is a schematic that illustrates a top view of another example of a photodetector 500c having a collection nanoapertures 502c. In some embodiments, the photodetectors 500a and 500b can be fabricated with features that are substantially similar to the example photodetectors 200, 250, 300, 400, 500a, and 500b of FIGS. 2A, 2C, and 3A-5B, but with different annular shapes.

The nanoapertures 502c are configured and arranged with multiple shapes, sizes, and spacings. In some embodiments, photodetectors such as the photodetector 500c can be configured with nanoapertures having multiple shapes and/or sizes in order to tune the photodetector 500c for predetermined bands and/or ranges of wavelengths of light, and/or to tune the sensitivity of the photodetector 500c for predetermined directions or ranges of angles of incoming light. For example, a photodetector can be configured with three different sizes of nanoapertures to make the photodetector more sensitive to three different bands of wavelengths.

FIGS. 6A-6I are schematics illustrating an example of a nanoaperture fabrication process 600. In some embodiments, the illustrated fabrication process can be used to make the example photodetectors 200, 250, 300, 400, and 500a-500c of FIGS. 2A, 2C, and 3A-5C.

Figure 6A:
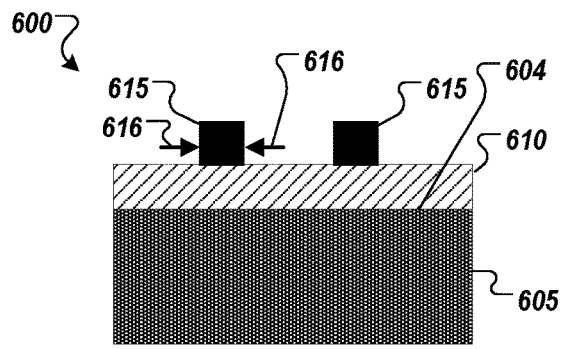
FIGS. 6A-6I are diagrams that show an example of a fabrication process for defining a coaxial nanoaperture of a photodetector.

In FIG. 6A, which is a side view of the example photodetector 600 during the fabrication process, a first mask layer 610 (e.g., $SiO_2$, silicon nitride) is formed on a planar face 604 of a semiconductor substrate 605 (e.g., silicon, doped germanium). A ring-shaped photoresist second mask layer 615 is patterned on the first mask layer 610 (e.g., using photolithography and development). In the illustrated example, the width of the ring, indicated by arrows 616 (e.g., the distance from the inner diameter to the outer diameter) is about 10-30 nm.

Figure 6B:
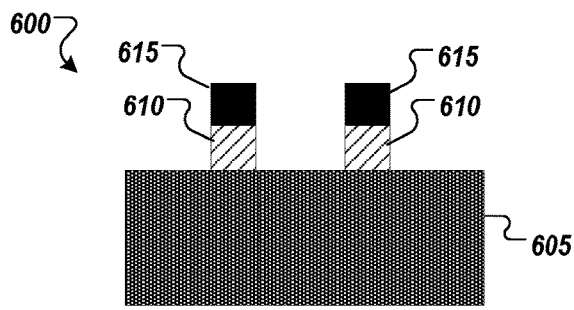
Figure 6C:
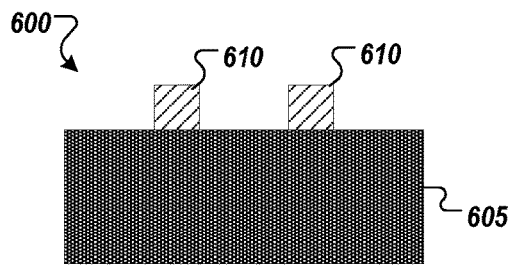
Figure 6D:
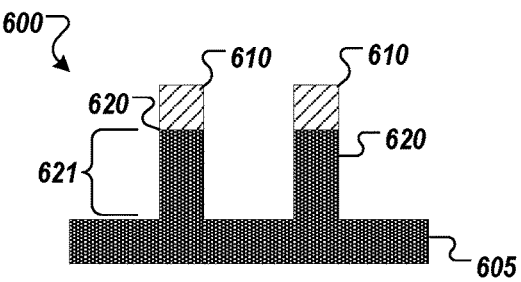

In FIG. 6B, the first mask layer 610 is then etched so that the ring shape of the patterned photoresist mask layer 615 (e.g., using a dry etching process) is transferred to the first mask layer 610. After the remaining photoresist is removed, as shown in FIG. 6C, the semiconductor substrate 605 is etched based on the pattern transferred to the first mask layer 610 (e.g., using a dry etching process) to define a nanoaperture 620 having a predetermined thickness 621, as shown in FIG. 6D.

Figure 6E:
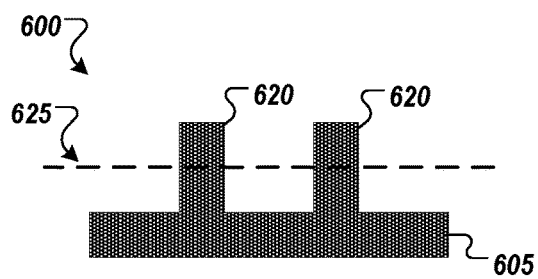
Figure 6F:
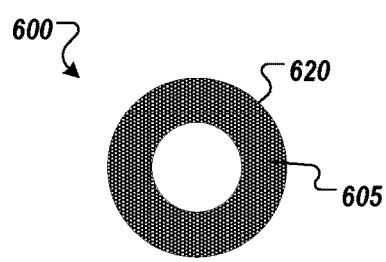

In FIG. 6E, the remaining portions of the first mask layer 610 are removed (e.g., by a wet etching process), leaving a semiconductor ring 620 behind. FIG. 6E includes a section line 625. FIG. 6F shows a top view of the photodetector 600 and the semiconductor ring that defines the nanoaperture 620 taken across the section line 625. In the illustrated example, the nanoaperture 620 is defined by a ring of semiconductor that is an integral part of the semiconductor substrate 605. In some embodiments, the semiconductor ring can be formed separate from the semiconductor substrate 605 rather than as integrally a part of the substrate 605.

Figure 6G:
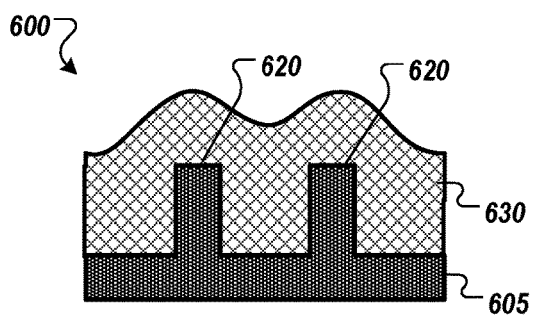

In FIG. 6G, a metallic layer 630 is formed, e.g., by deposition, on the semiconductor substrate 605 and the nanoaperture 620. In some embodiments, the metallic layer 630 can be copper (Cu), gold (Au), silver (Ag), aluminum (Al), or other appropriate metal that can form a Schottky junction with the semiconductor ring (e.g., metals that are compatible with CMOS fabrication techniques and/or equipment). In some embodiments, the metallic layer 630 can be deposited using a sputtering process.

Figure 6H:
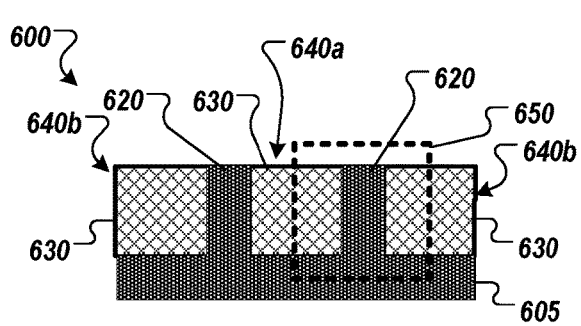

In FIG. 6H, a portion of the metal 630 is removed to expose a top surface of the nanoaperture 620. In some embodiments, this can be done by using a chemical-mechanical polishing (CMP) process to planarize the metallic layer 630 until the coaxial nanoaperture 620 is exposed. The resulting formation provides a tubular pillar or ring of semiconductor with a metallic region 640a that fills the inner region of the semiconductor ring and a metallic region 640b surrounding the exterior of the semiconductor ring.

Figure 6I:
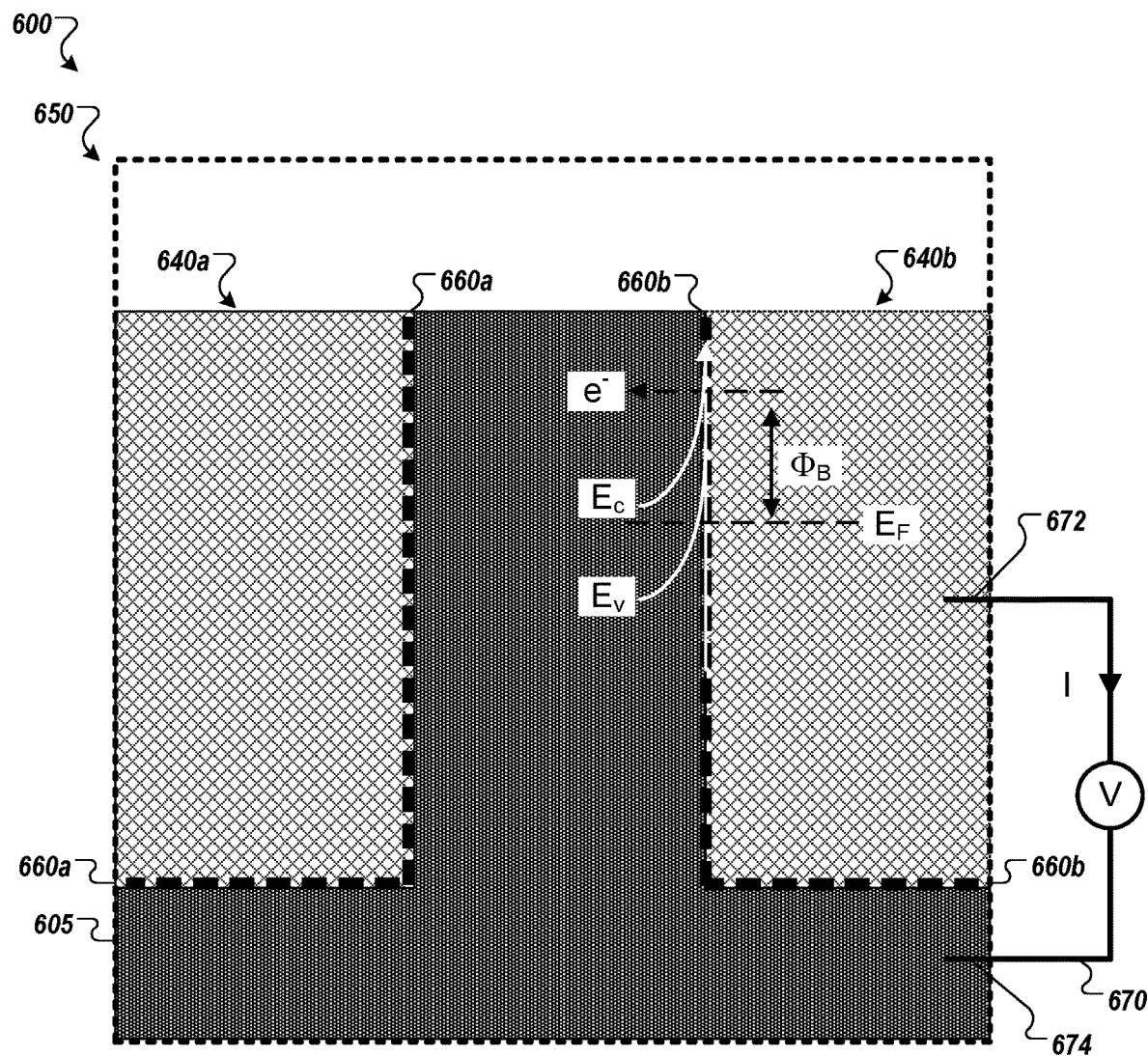

A region 650 of the photodetector 600 is shown in enlarged detail in FIG. 6I. The interface between the semiconductor ring of the coaxial nanoaperture 620 and the metallic region 640a forms a Schottky junction 660a. The interface between the semiconductor ring of the coaxial nanoaperture 620 and the metallic region 640b forms another Schottky junction 660b. The metallic region 640b is connected to the semiconductor substrate 605 to form an electric circuit 670 between an electrical contact 672 and an electrical contact 674. Schottky junction 660a is allowed to float electrically. When exposed to light, the coaxial nanoaperture generates hot carriers, whose energy is greater than the Schottky barrier. Thus, they can be captured and harvested by a Schottky junction at the metal-semiconductor interface in the coaxial nanoaperture and flow into the semiconductor through an internal photoemission process, which causes electrical current to flow through the electric circuit 670. In some implementations, such current flow can be detected, measured, and/or otherwise used by additional circuitry (not shown) to provide photodetection capabilities.

FIGS. 7A-7E are schematics that illustrate an example of another fabrication process for forming a nanoaperture of a photodetector 700. In some embodiments, the illustrated fabrication process can be used to make the example photodetectors 200, 250, 300, 400, and 500a-500c of FIGS. 2A, 2C, and 3A-5C.

Figure 7A:
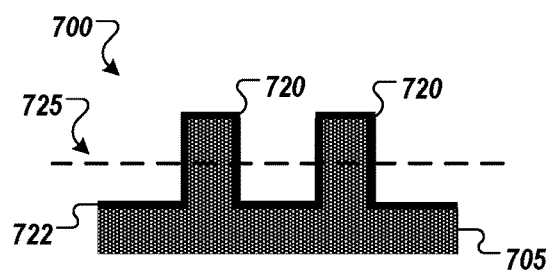
FIGS. 7A-7E are diagrams that show an example of a fabrication process for defining a coaxial nanoaperture of a photodetector.
Figure 7B:
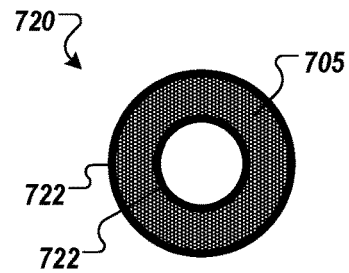

FIG. 7A, is a side view of the photodetector 700 during a midpoint of another fabrication process. In the illustrated example, a nanoaperture 720 is defined on a semiconductor substrate 705. In some embodiments, the semiconductor substrate 705 can be the example semiconductor substrate 605 of FIG. 6E, and the nanoaperture 720 can be the example coaxial nanoaperture 720 formed by the process described in the previous discussion of FIGS. 6A-6E. In the illustrated example, an insulating layer 722 (e.g., an electrically insulating dielectric material such as silicon oxide) is formed upon the semiconductor substrate 705 and the semiconductor ring structure of the nanoaperture 720. FIG. In some embodiments, the insulating layer 722 can have a thickness of about 2 nm to about 5 nm. 7A includes a section line 725. FIG. 7B shows a top view of the photodetector 700 and the nanoaperture 720 taken across the section line 725.

Figure 7C:
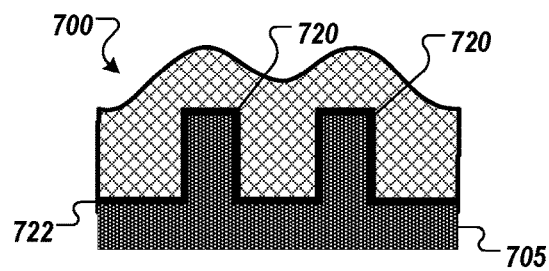

In FIG. 7C, which is another side view of the photodetector 700, a metallic layer 730 is deposited on the semiconductor substrate 705 and the nanoaperture 720. In some embodiments, the metallic layer 730 can be copper (Cu) or any other appropriate metal that forms a Schottky junction with the semiconductor (e.g., metals that are compatible with CMOS fabrication techniques and equipment). In some embodiments, the metal layer 730 can be deposited using a sputtering process.

Figure 7D:
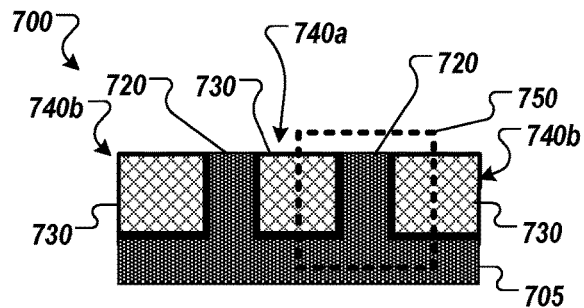

In FIG. 7D, the top surface of the metal layer 730 is removed to expose the nanoaperture 720. In some embodiments, remove of the metal layer 730 can be done by using a chemical-mechanical polishing (CMP) process to planarize the metallic layer 730 until the coaxial nanoaperture 720 is exposed. The resulting formation provides a tubular pillar of semiconductor with a metallic region 740a occupying the interior of the pillar and a metallic region 740b surrounding the exterior of the pillar. The metallic region 740a is electrically insulated from the semiconductor substrate 705 and the nanoaperture 720 by a portion of the insulating layer 722. The metallic region 740b is electrically insulated from the semiconductor substrate 705 and the coaxial nanoaperture 720 by another portion of the insulating layer 722.

Figure 7E:
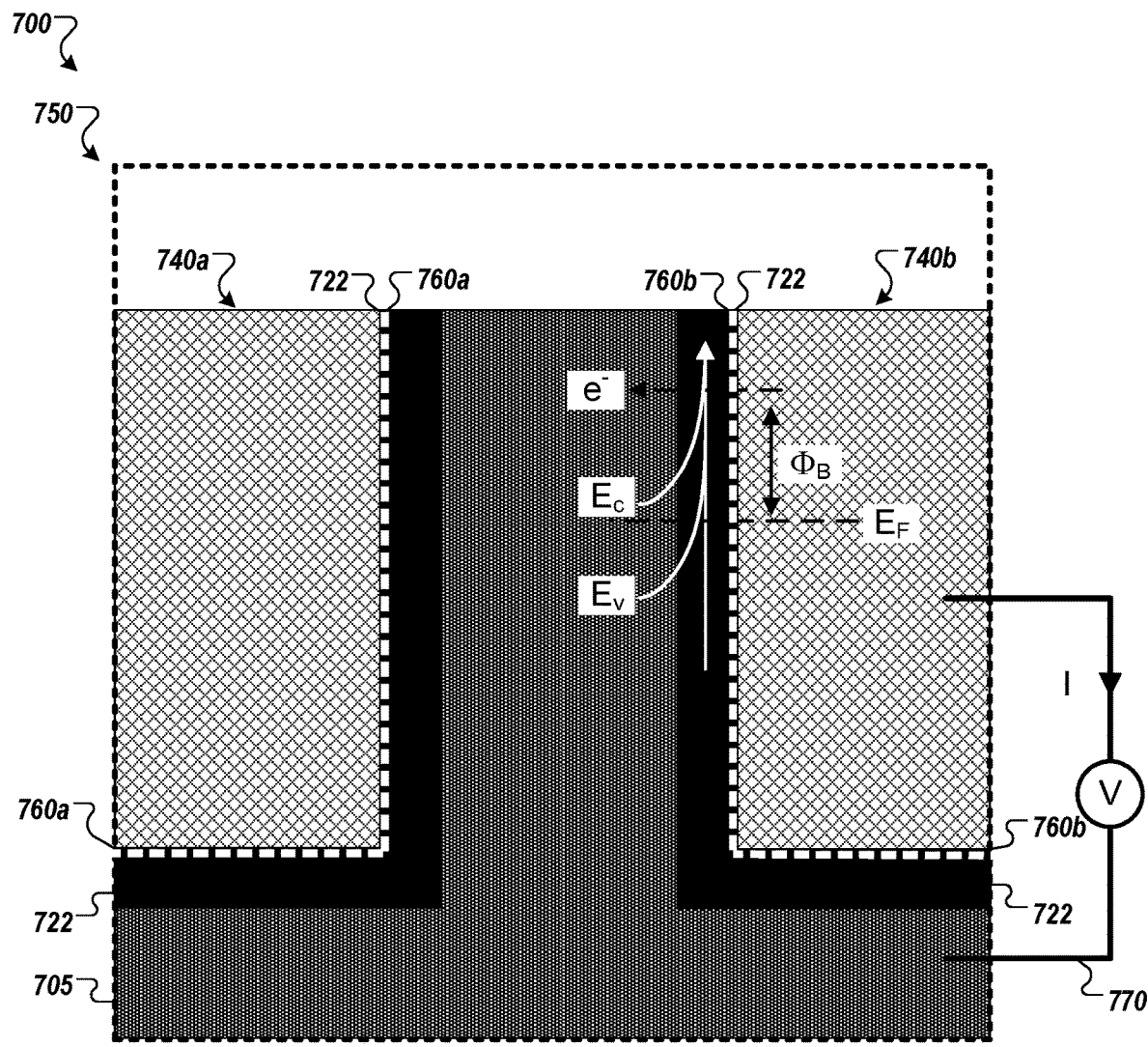

FIG. 7E is an enlarged side view of the region 750 of the photodetector 700 shown in FIG. 7D. The portion of the insulating layer 722 between the semiconductor substrate 705 and the metallic region 740a forms the metal-insulator-semiconductor (MIS) junction 760a. The portion of the insulating layer 722 between the semiconductor substrate 705 and the metallic region 740b forms another the metal-insulator-semiconductor (MIS) junction 760b. The metallic region 740b is connected to the semiconductor substrate 705 to form an electric circuit 770. The metal-insulator-semiconductor (MIS) junction 760a is allowed to float electrically. When exposed to light, the coaxial nanoaperture generates hot carriers. Since the energy band diagram becomes very narrow due to high applied voltage, they can be tunneling through MIS junction and flow into the semiconductor, generating tunneling photocurrent, which causes electrical current to flow through the electric circuit 770. In some implementations, such current flow can be detected, measured, and/or otherwise used by additional circuitry (not shown) to provide photodetection capabilities.

Figure 8:
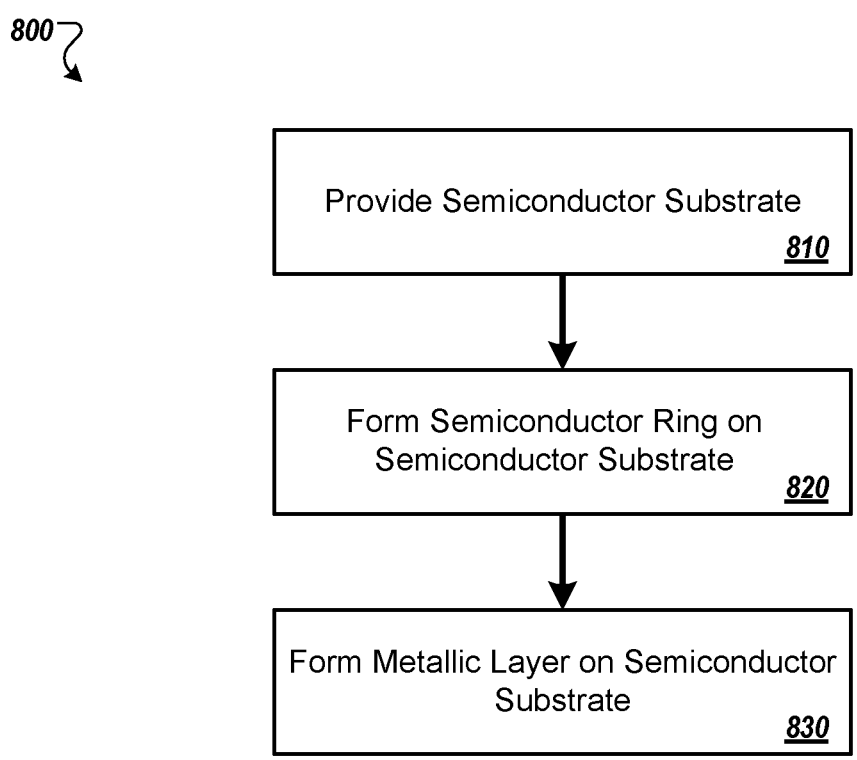
FIG. 8 is a flowchart that shows an example process for fabricating a photodetector.

FIG. 8 is a flow chart that depicts an exemplary process 800 for fabricating a photodetector. In some embodiments, the process 800 can be used to make the example photodetectors 200, 250, 300, 400, 500a-500c, 600, and/or 700 of FIGS. 2A, 2C, and 3A-7E.

At 810, a semiconductor substrate is provided. For example, the example semiconductor substrate 605 of FIGS. 6A-6I can be provided.

At 820, a semiconductor ring is formed on the semiconductor substrate. For example, the semiconductor substrate 605 can be etched or otherwise processed to form the semiconductor ring that defines the example coaxial nanoaperture 620 of FIG. 6F.

In some implementations, forming the semiconductor ring can include depositing a hard mask layer on the semiconductor substrate, patterning a photoresist layer on the hard mask layer, the photoresist layer having a predetermined pattern, etching the hard mask layer based on the photoresist layer to expose the semiconductor substrate, and etching the semiconductor substrate based on the hard mask layer to define the semiconductor ring based on the predetermined pattern, for example, as discussed in the descriptions of FIGS. 6A-6F.

In some implementations, forming the metallic layer on the semiconductor substrate can include depositing a metallic material over the semiconductor substrate and the semiconductor ring, and planarizing the metallic material to expose the semiconductor ring, for example, as discussed in the descriptions of FIGS. 6G and 6H.

In some implementations, the semiconductor ring can be formed to have the thickness 621 being between about 50 nm and about 200 nm perpendicular to the major plane of the semiconductor substrate. For example, the semiconductor ring that defines the nanoaperture 620 can project (e.g., thickness 621) about 50 nm to about 200 nm away from the semiconductor substrate 602.

At 830, a metallic layer is formed on the semiconductor substrate. The metallic layer includes a first region that surrounds the semiconductor ring and forms a Schottky junction with the semiconductor ring, and a second region that fills an inner area of the semiconductor ring. For example, the example metallic layer 630 can be sputtered or otherwise deposited over the semiconductor substrate to fill the metallic region 640a within the semiconductor ring of the nanoaperture 620, and to fill the metallic region 640a surrounding the semiconductor ring of the nanoaperture 620.

In some implementations, the process 800 can cause at least a portion of the metallic layer to form a Schottky junction with the semiconductor substrate. For example, the example Schottky junction 660a extends between the metallic regions 640a and 640b and the semiconductor substrate 602.

In some implementations, the semiconductor ring and the metallic layer can be configured to convert photons having wavelengths between 2 microns and 30 microns. For example, the example coaxial nanoapertures of the example photodetectors 200, 250, 300, 400, and 500a-500c can have predetermined shape geometries and distributions that tune the photodetectors for particular wavelengths and/or directionalities of incoming light.

In some implementations, the process can also include forming an electrically insulating dielectric material surrounding the semiconductor ring, wherein the electrically insulating dielectric material is between the semiconductor ring and the metallic layer in the first region. In some implementations, the process 800 can include forming an electrically insulating dielectric material between the semiconductor substrate and the metallic layer in the first region. For example, the insulating layer 722 of FIGS. 7D and 7E can be formed. In some embodiments, the insulating dielectric material can be an oxide layer.

In some implementations, the semiconductor ring and the metallic layer can be formed by CMOS-compatible fabrication processes. For example, silicon or doped germanium can be used to form at least one of the semiconductor substrate and ring, and metals such as copper can be deposited by sputtering. Various physical features can be performed by photo and/or chemical etching, and/or mechanical polishing.

In some implementations, the semiconductor ring can be circular, polygonal, curved, or otherwise formed with combinations of these and/or other appropriate shapes that can be enclosed to form a ring or tubular structure. For example, the example nanoapertures of FIGS. 2A-4 and 6A-7E are generally circular across their major planes, the example nanoapertures 502a of FIG. 5A are generally rectangular, the example nanoapertures 502b of FIG. 5B are generally elliptical, and the example nanoapertures 502c of FIG. 5C include a combination of octagonal and star forms.

In some implementations, the process 800 can include forming a collection of the semiconductor ring interspersed across the semiconductor substrate. For example, the photodetectors 200, 250, 300, 400, and 500a-500c of FIGS. 2A-5C include a collection of nanoapertures defined by semiconductor rings arranged in predetermined patterns across a semiconductor substrate.

Although a few implementations have been described in detail above, other modifications are possible. In addition, other steps may be provided, or steps may be eliminated, from the described flows, and other components may be added to, or removed from, the described systems. Accordingly, other implementations are within the scope of the following claims.

What is claimed is:

1. A photodetector comprising:
   a semiconductor substrate;
   a semiconductor annulus on a planar face of the semiconductor substrate; and
   a metal layer on the semiconductor substrate, wherein the metal layer comprises a first region surrounding the semiconductor annulus and comprises a second region filling an interior region to the semiconductor annulus, and the metal layer in the first region forms a Schottky junction with the semiconductor annulus, and the metal layer in the second region defined by the semiconductor annulus is configured to form one or more resonant epsilon-near-zero modes for transmission of photons;
   wherein the photodetector is configured to convert photons having wavelengths between 2 microns and 30 microns to electrical current.

2. The photodetector of claim 1, further comprising an electrically insulating dielectric material on a surface of the semiconductor annulus, wherein the electrically insulating dielectric material is between the semiconductor annulus and the metal layer in the first region.

3. The photodetector of claim 2, wherein the electrically insulating dielectric material is an oxide layer.

4. The photodetector of claim 1, wherein the semiconductor annulus is integrally formed with the semiconductor substrate.

5. The photodetector of claim 1, wherein at least one of the semiconductor substrate or the semiconductor annulus is germanium.

6. The photodetector of claim 1, wherein the metal layer comprises one or more of copper, gold, silver, or aluminum.

7. The photodetector of claim 1, wherein the semiconductor annulus is circular.

8. The photodetector of claim 1, wherein the semiconductor annulus is polygonal.

9. The photodetector of claim 1, further comprising a plurality of the semiconductor annuli arranged in an array on the semiconductor substrate.

10. The photodetector of claim 1, wherein the semiconductor annulus has a thickness of between 50 nm and 200 nm perpendicular to the planar face of the semiconductor substrate.

11. The photodetector of claim 1, further comprising a first electrical contact electrically connected to the semiconductor substrate and a second electrical contact electrically connected to the metal layer in the first region.

12. The photodetector of claim 1, wherein the semiconductor annulus has an inner diameter between about 100 nm and about 2000 nm.

13. The photodetector of claim 1, wherein the semiconductor annulus has a width between about 10 nm and about 100 nm parallel to the planar face of the semiconductor substrate.

14. A method of fabricating a photodetector, the method comprising:
 providing a semiconductor substrate;
 forming a semiconductor annulus on a planar face of the semiconductor substrate; and
 forming a metal layer on the planar face of the semiconductor substrate, wherein the metal layer comprises:
  a first region surrounding the semiconductor annulus and forms a Schottky junction with the semiconductor annulus; and
  a second region filling an interior region to the semiconductor annulus and configured to form one or more resonant epsilon-near-zero modes for transmission of photons, wherein the photodetector is configured to convert photons having wavelengths between 2 microns and 30 microns to electrical current.

15. The method of claim 14, further comprising forming an electrically insulating dielectric material on a surface the semiconductor annulus, wherein the electrically insulating dielectric material is between the semiconductor annulus and the metal layer in the first region.

16. The method of claim 15, wherein the electrically insulating dielectric material is an oxide layer.

17. The method of claim 14, wherein forming the semiconductor annulus comprises:
 growing a hard mask layer on the planar face of the semiconductor substrate;
 patterning a photoresist layer on the hard mask layer, the photoresist layer having a predetermined pattern;
 etching the hard mask layer based on the photoresist layer to expose the semiconductor substrate; and
 etching the semiconductor substrate based on the hard mask layer to define the semiconductor annulus based on the predetermined pattern.

18. The method of claim 14, wherein forming the metal layer on the semiconductor substrate comprises:
 depositing a metal over the semiconductor substrate and the semiconductor annulus; and
 planarizing the metal to expose the semiconductor annulus.

19. The method of claim 14, wherein the semiconductor annulus and the metal layer are formed by CMOS-compatible fabrication processes.

20. The method of claim 14, wherein at least one of the semiconductor substrate or the semiconductor annulus is germanium.

21. The method of claim 14, wherein the metal layer comprises one or more of copper, gold, silver, or aluminum.

22. The method of claim 14, wherein the semiconductor annulus is circular.

23. The method of claim 14, wherein the semiconductor annulus is polygonal.

24. The method of claim 14, further comprising a plurality of the semiconductor annuli arranged in an array on the semiconductor substrate.

25. The method of claim 14, wherein the semiconductor annulus has a thickness of between 50 nm and 100 nm perpendicular to the planar face of the semiconductor substrate.

26. The method of claim 14, wherein the semiconductor annulus and the metal layer are configured to convert photons having wavelengths between 2 microns and 30 microns.

27. The method of claim 14, wherein at least a portion of the metal layer defines a Schottky junction with the semiconductor substrate.

* * * * *

UNITED STATES PATENT AND TRADEMARK OFFICE
CERTIFICATE OF CORRECTION

PATENT NO. : 11,688,820 B2
APPLICATION NO. : 17/066735
DATED : June 27, 2023
INVENTOR(S) : Sang-Hyun Oh and Daehan Yoo It is certified that error appears in the above-identified patent and that said Letters Patent is hereby corrected as shown below:

In the Claims

Column 11, Line 23, Claim 15, after "surface", insert -- of --.

Signed and Sealed this
Eighth Day of October, 2024

Katherine Kelly Vidal
*Director of the United States Patent and Trademark Office*